United States Patent
Park et al.

(10) Patent No.: US 10,132,980 B2
(45) Date of Patent: Nov. 20, 2018

(54) DISPLAY APPARATUS

(71) Applicant: Samsung Display Co., Ltd., Yongin-si, Gyeonggi-Do (KR)

(72) Inventors: Seki Park, Hwaseong-si (KR); Dohun Kim, Changwon-si (KR); Jooyoung Kim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/171,491

(22) Filed: Jun. 2, 2016

(65) Prior Publication Data

US 2017/0102492 A1  Apr. 13, 2017

(30) Foreign Application Priority Data

Oct. 13, 2015  (KR) .................. 10-2015-0143068

(51) Int. Cl.
*G02B 6/00* (2006.01)
*F21V 8/00* (2006.01)
*H01L 33/00* (2010.01)
*H01L 33/06* (2010.01)

(52) U.S. Cl.
CPC .......... *G02B 6/003* (2013.01); *G02B 6/0073* (2013.01); *H01L 33/0025* (2013.01); *H01L 33/06* (2013.01)

(58) Field of Classification Search
CPC .. G02B 6/0016; G02B 6/0068; G02B 6/0028; G02B 6/003; G02B 6/0073; G02B 5/045; G02B 6/0018
See application file for complete search history.

(56) References Cited

U.S. PATENT DOCUMENTS

| | | | | |
|---|---|---|---|---|
| 7,350,958 B2 * | 4/2008 | Yang | .................. | G02B 6/0016 349/65 |
| 7,427,145 B2 * | 9/2008 | Jang | .................. | G02B 6/0031 257/100 |
| 7,478,937 B2 * | 1/2009 | Hara | .................. | G02B 6/0016 349/32 |
| 2004/0109664 A1 * | 6/2004 | Ohtsuki | .............. | G02B 6/0026 385/146 |
| 2006/0285332 A1 * | 12/2006 | Goon | .................. | G02B 6/4206 362/327 |
| 2007/0279551 A1 * | 12/2007 | Umebayashi | ........ | G02B 6/0053 349/65 |

(Continued)

FOREIGN PATENT DOCUMENTS

| | | |
|---|---|---|
| KR | 1020040075267 A | 8/2004 |
| KR | 1020130002781 A | 1/2013 |
| KR | 1020140061151 A | 5/2014 |

*Primary Examiner* — Christopher Stanford
(74) *Attorney, Agent, or Firm* — Cantor Colburn LLP

(57) ABSTRACT

A display apparatus includes a display panel and a backlight unit which provides light to the display panel. The backlight unit includes a light guide part, a light source part facing a light incident surface of the light guide part and including a circuit board, a first light emitting device package disposed on the circuit board, and a second light emitting device package disposed on the circuit board and which generates light having a wavelength different from that of light generated by the first light emitting device package, and an optical member disposed on at least one light emitting device package of the first and second light emitting device packages and including a plurality of rod-type lenses.

17 Claims, 13 Drawing Sheets

(56) References Cited

U.S. PATENT DOCUMENTS

| | | | | |
|---|---|---|---|---|
| 2007/0291485 A1* | 12/2007 | Peng | ..................... | F21K 9/00 |
| | | | | 362/240 |
| 2008/0074902 A1* | 3/2008 | Oh | ..................... | G02B 6/0068 |
| | | | | 362/612 |
| 2008/0259641 A1* | 10/2008 | Suzuki | ..................... | G02B 5/045 |
| | | | | 362/612 |
| 2009/0262280 A1* | 10/2009 | Kwon | ..................... | G02F 1/133621 |
| | | | | 349/62 |
| 2010/0002465 A1* | 1/2010 | Tsang | ..................... | G02B 6/0021 |
| | | | | 362/612 |
| 2010/0135043 A1* | 6/2010 | Wang | ..................... | G02B 6/0016 |
| | | | | 362/628 |
| 2010/0177258 A1 | 7/2010 | Shinozaki et al. | | |
| 2010/0202131 A1* | 8/2010 | Kim | ..................... | H01L 33/58 |
| | | | | 362/97.1 |
| 2012/0075840 A1* | 3/2012 | Sun | ..................... | G02B 6/003 |
| | | | | 362/97.1 |

\* cited by examiner

DISPLAY APPARATUS

This application claims priority to Korean Patent Application No. 10-2015-0143068, filed on Oct. 13, 2015, and all the benefits accruing therefrom under 35 U.S.C. § 119, the content of which in its entirety is herein incorporated by reference.

BACKGROUND

1. Field

The disclosure herein relates to a display apparatus, and more particularly, to a display apparatus including an optical member on a light emitting device package.

2. Description of the Related Art

A non-emissive display apparatus, such as a liquid crystal display apparatus, typically includes a backlight unit for supplying light to a display panel because a display panel of the non-emissive display apparatus to display an image does not emit light by itself. The backlight unit used for the display apparatus may include a light emitting unit including a plurality of light emitting device packages to improve color reproducibility of the display apparatus while reducing power consumption.

Recently, methods of adding a plurality of optical sheets or adding an optical layer on a light emitting unit, to improve light efficiency of a backlight unit including a light emitting device package are being proposed.

SUMMARY

The disclosure provides a display apparatus in which a view angle of light emitted from a light emitting device package is adjusted to improve efficiency of light incident into a light guide part and remove hot spots.

According to an embodiment of the inventive concept, a display apparatus includes: a display panel; and a backlight unit which provides light to the display panel, wherein the backlight unit includes: a light guide part having a light emission surface, a reflection surface facing the light emission surface, and connection surfaces which connects the light emission surface to the reflection surface; a light source part including a circuit board, a first light emitting device package disposed on the circuit board, and a second light emitting device package disposed on the circuit board and which generates light having a wavelength different from a wavelength of light generated by the first light emitting device package, where the light source part facing a light incident surface of the connection surfaces; and an optical member disposed on at least one light emitting device package of the first and second light emitting device packages, where the optical member includes a plurality of rod-type lenses.

In an embodiment, each of the plurality of rod-type lenses may include: a lens incident surface facing the at least one light emitting device package of the first and second light emitting device packages; and a lens emission surface facing the lens incident surface, where the lens emission surface may include a curved surface or an inclined surface, and the lens emission surface extends in an extending direction of the plurality of rod-type lenses.

In an embodiment, each of the plurality of rod-type lenses may have a semicircular, semielliptical or triangular cross-sectional shape in a direction perpendicular to the extending direction of the plurality of rod-type lenses.

In an embodiment, the second light emitting device package may generate light having a longer wavelength than a wavelength of light generated by the first light emitting device package.

In an embodiment, the optical member may be disposed on the second light emitting device package, and a cross-sectional shape of each of the plurality of rod-type lenses in a direction perpendicular to the extending direction of the plurality of rod-type lenses may have a maximum width (d) in a direction parallel to the lens incident surface and a maximum height (h) in a normal direction of the lens incident surface, and a ratio of the maximum height (h) to the maximum width (d) may satisfy the following inequation: $h/d \geq 1$.

In an embodiment, the optical member may be disposed on the first light emitting device package, and a cross-sectional shape of each of the plurality of rod-type lenses in a direction perpendicular to the extending direction of the plurality of rod-type lenses may have a maximum width (d) in a direction parallel to the lens incident surface and a maximum height (h) in a normal direction of the lens incident surface, and a ratio of the maximum height (h) to the maximum width (d) may satisfy the following inequation: $h/d < 1$.

In an embodiment, the optical member may include: a first optical member disposed on the first light emitting device package; and a second optical member disposed on the second light emitting device package. In such an embodiment, a cross-sectional shape of each of the plurality of rod-type lenses of the first optical member in a direction perpendicular to the extending direction of the plurality of rod-type lenses has a maximum width (d1) in a direction parallel to the lens incident surface and a maximum height (h1) in a normal direction of the lens incident surface, a cross-sectional shape of each of the plurality of rod-type lenses of the second optical member in a direction perpendicular to the extending direction of the plurality of rod-type lenses has a maximum width (d2) in a direction parallel to the lens incident surface and a maximum height (h2) in a normal direction of the lens incident surface, a ratio of the maximum height (h1) to the maximum width (d1) of the first optical member may satisfy the following condition: $h1/d2 < 1$, and a ratio of the maximum height (h2) to the maximum width (d2) of the second optical member may satisfy the following condition: $h2/d2 \geq 1$.

In an embodiment, the first and second light emitting device packages may be alternately disposed on the circuit board.

In an embodiment, the first light emitting device package may generate a blue light, and the second light emitting device package may generate a magenta light.

In an embodiment, the first light emitting device package may generate a blue light, and the second light emitting device package may generate a green light or a red light.

In an embodiment, each of the first and second light emitting device packages may include: a body part in which a cavity is defined; a light emitting device disposed in the cavity; and a molding part which fills the cavity and surrounds the light emitting device.

In an embodiment, the optical member may be disposed on the molding part, a top surface of the body part, and a side surface of the body part.

In an embodiment, the rod-type lenses may be disposed adjacent to one another.

In an embodiment, the rod-type lenses may be disposed to be spaced apart from one another, and each of the rod-type lenses may include a base and a protrusion disposed on the base.

In an embodiment of the inventive concept, a display apparatus includes: a display panel; and a backlight unit which provides light to the display panel. In such an embodiment, the backlight unit includes: a light guide part having a light emission surface, a reflection surface facing the light emission surface, and connection surfaces which connects the light emission surface to the reflection surface; a light source part including a circuit board, first light emitting device packages disposed at an interval of a first distance on a central area of the circuit board, second light emitting device packages disposed at an interval of a second distance on a peripheral area of the circuit board, the light source part facing a light incident surface of the connection surfaces; and optical members disposed on at least one light emitting device packages of the first and second light emitting device packages, where the optical members includes a plurality of rod-type lenses.

In an embodiment, the first distance may be less than the second distance.

In an embodiment, each of the plurality of rod-type lenses may include: a lens incident surface facing the corresponding light emitting device package of the at least one light emitting device packages; and a lens emission surface facing the lens incident surface, where the lens emission surface includes a curved surface or an inclined surface, and the lens emission surface may extend in an extending direction of the plurality of rod-type lenses.

In an embodiment, each of the plurality of rod-type lenses may have a semicircular, semielliptical, or triangular cross-sectional shape in a direction perpendicular to the extending direction of the plurality of rod-type lenses.

In an embodiment, the optical members may be disposed on the second light emitting device packages, and a cross-sectional shape of each of the plurality of rod-type lenses may have a maximum width (d) in a direction parallel to the lens incident surface and a maximum height (h) in a normal direction of the lens incident surface, where a ratio of the maximum height (h) to the maximum width (d) may satisfy the following inequation: h/d<1.

In an embodiment, each of the first and second light emitting device packages may include: a body part in which a cavity is defined; a light emitting device disposed in the cavity; and a molding part which fills the cavity and surrounds the light emitting device, where the light emitting device may emit a blue light, and the molding part may include a phosphor which is excited by the blue light to generate a white light.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
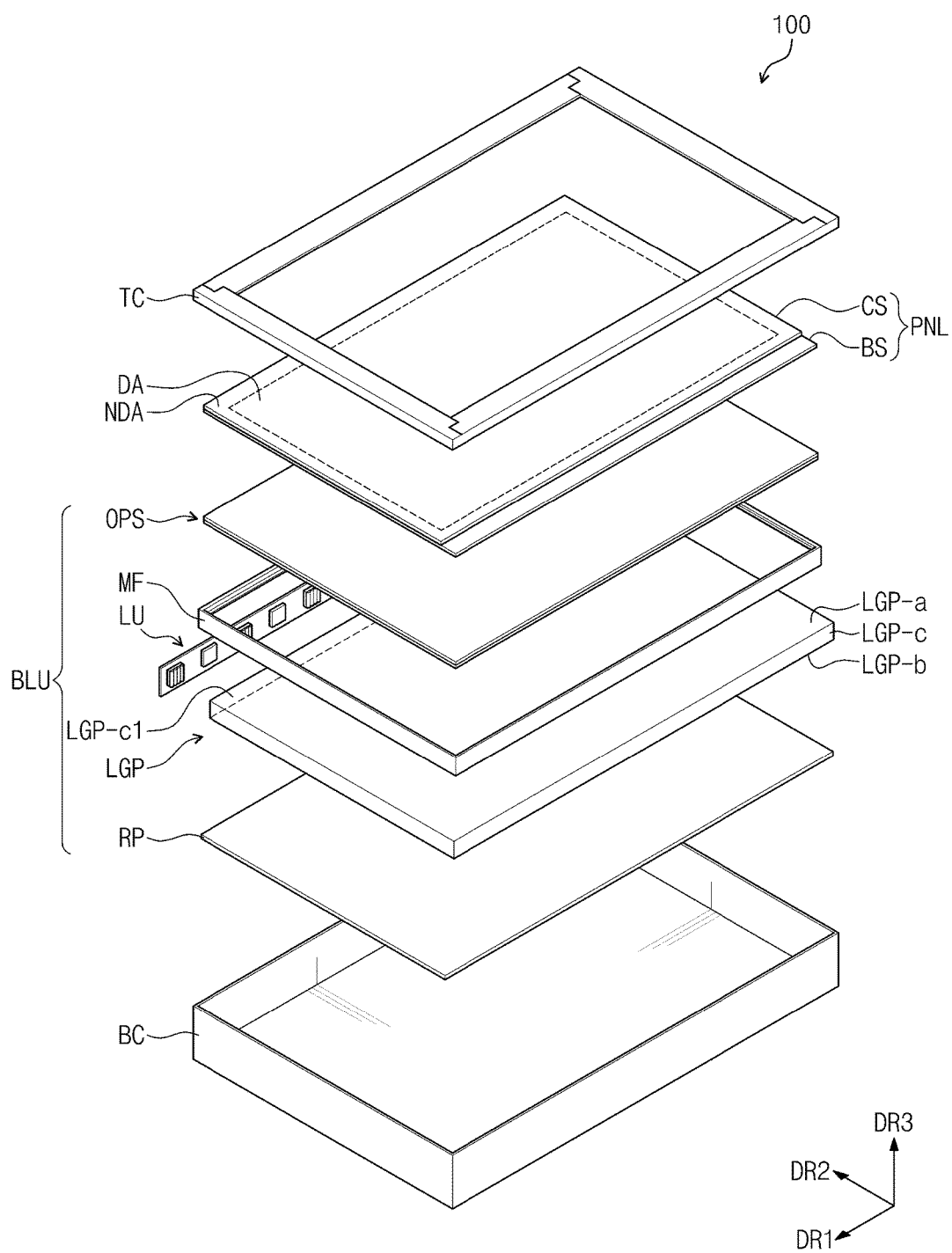
FIG. 1 is an exploded perspective view of an embodiment of a display apparatus according to the inventive concept.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a display apparatus according to the invention will be described in detail with reference to the accompanying drawings.

FIG. 1 is an exploded perspective view of an embodiment of a display apparatus according to the inventive concept.

An embodiment of a display apparatus 100 may include a display panel PNL, a backlight unit BLU, a top cover TC, and a bottom cover BC. Here, for convenience of description, a direction in which an image is provided from the display apparatus 100 is defined as an upward direction, a direction opposite to the upward direction is defined as a downward direction.

The display panel PNL may display an image, and the backlight unit BLU may provide light to the display panel. The bottom cover BC of the display apparatus 100 may accommodate the display panel PNL and the backlight unit BLU, and the top cover TC may be coupled to the bottom cover BC in which the display panel PNL is accommodated.

The display panel PNL may have a plane shape a rectangular shape. Herein, a plane shape is defined as a shape when viewed from a top plan view when viewed in the downward direction. In one embodiment, for example, the display panel PNL may have a rectangular shape with a long side extending in a first direction DR1 and a short side extending in a second direction DR2, as shown in FIG. 1.

The display panel PNL may have a display area DA on which an image is displayed and a non-display area NDA disposed near at least a side of the display area DA outside the display area DA. An edge portion of the display panel PNL may be covered by the top cover TC. In one embodiment, for example, the non-display area NDA of the display panel PNL may be covered by the top cover TC.

In an embodiment, the display panel PNL of the display apparatus 100 may be a liquid crystal display panel. The display panel PNL may display an image by using light emitted from the backlight unit BLU. However, a kind of display panel PNL of the display apparatus 100 is not limited thereto. In an alternative embodiment, the display panel PNL may be a different kind of display panel such as a nano-crystal display panel, an electrophoretic display panel, or an electro-wetting display panel.

Hereinafter, for convenience of description, an embodiment where the display panel PNL is the liquid crystal display panel will be described in detail. In such an embodiment, the display panel PNL may include a base substrate BS, an opposite substrate CS disposed opposite to the base substrate BS, and a liquid crystal layer (not shown) disposed between the base substrate BS and the opposite substrate CS.

In an embodiment, the base substrate BS of the display panel PNL may include a plurality of pixel electrodes (not shown) and a plurality of thin film transistors (not shown) electrically connected to the pixel electrodes, respectively. Each of the thin film transistors switches a driving signal that is provided to the corresponding pixel electrode thereof. In such an embodiment, the opposite substrate CS may include a common electrode (not shown) for generating electric fields, which control an arrangement of liquid crystals, together with the pixel electrodes, and a color filter (not shown). The common electrode together with the plurality of pixel electrodes generates the electric field in the liquid crystal layer (not shown), and the color filter filters the light emitted from the backlight unit BLU to emit color light.

However, the base substrate BS and the opposite substrate CS are not limited to the above-described structure. In one alternative embodiment, for example, the color filter and the common electrode may be disposed in the base substrate BS instead of the opposite substrate CS.

An embodiment of the display apparatus 100 may include the backlight unit BLU disposed under the display panel PNL. The backlight unit BLU may include a light source part LU, a light guide part (e.g., a light guide plate) LGP, a reflection part (e.g., layer or sheet) RP, and optical sheets OPS. In such an embodiment, the backlight unit BLU may further includes a mold frame MF that supports the display panel PNL and the optical sheets OPS.

In such an embodiment, the backlight unit BLU may include the light source part LU that generates light and a light guide part LGP that guides the light emitted from the light source part LU to the display panel PNL.

The light guide part LGP has a surface facing the display panel PNL and another surface opposite to the surface, and the reflection part RP may be disposed to face the another surface of the light guide part LGP opposite to the surface facing the display panel PNL. The reflection part RP may be disposed between the light guide part LGP and the bottom cover BC. The reflection part RP may reflect the light incident thereto from the light guide part LGP back to the light guide part LGP to be guided to the display panel PNL, thereby improving light efficiency of the display apparatus 100.

The optical sheets OPS may be disposed between the light guide part LU and the display panel PNL. The optical sheets OPS may control the light emitted from the light source part LU. The optical sheets OPS may include a diffusion sheet, a prism sheet, and a protection sheet, for example.

The mold frame MF may fix the optical sheets OPS disposed under the display panel PNL. In an embodiment, the mold frame MF may include a fixing member, which fixes or supports the display panel PNL and the optical sheets OPS or other components, e.g., a portion of the light source part LU, for example, a hook protrusion (not shown).

In such an embodiment described with reference to FIG. 1, the light guide part LGP that guides the light to the display panel PNL may include a light emission surface LGP-a, a reflection surface LGP-b facing the light emission surface LGP-a, and a connection surface LGP-c connecting the light emission surface LGP-a to the reflection surface LGP-b.

The light emission surface LGP-a may correspond to the surface facing the display panel PNL. Also, although not shown, patterns for emitting the light incident to the light guide part LGP toward the display panel may be defined in the reflection surface LGP-b.

The connection surface LGP-c of the light guide part LGP may correspond to a side surface of the light guide part LGP. In such an embodiment, a surface of the connection surfaces LGP-c of the light guide part LGP, which faces the light source part LU may be a light incident surface LGP-c1 of the light guide part LGP, and the light source part LU may be disposed adjacent to the light incident surface LGP-c1.

In an embodiment of the display apparatus 100, the light emitted from the light source part LU may be incident into the light incident surface LGP-c2 of the light guide part LGP, and then, the incident light may be transmitted to the display panel PNL through the light emission surface LGP-a of the light guide part LGP.

The bottom cover BC of the display apparatus 100 may be disposed under the backlight unit BLU. The bottom cover BC may accommodate the display panel PNL and the backlight unit BLU, which are disposed thereabove. The bottom cover BC may include or be formed of a metal material including stainless steel ("SUS"), galvalume, and aluminum or plastic.

In an embodiment, the top cover TC may have a shape that defines an opening corresponding to the display area DA of the display panel PNL and covers an edge of the display panel PNL. In such an embodiment, the display area DA may be exposed to the outside.

Figure 2:
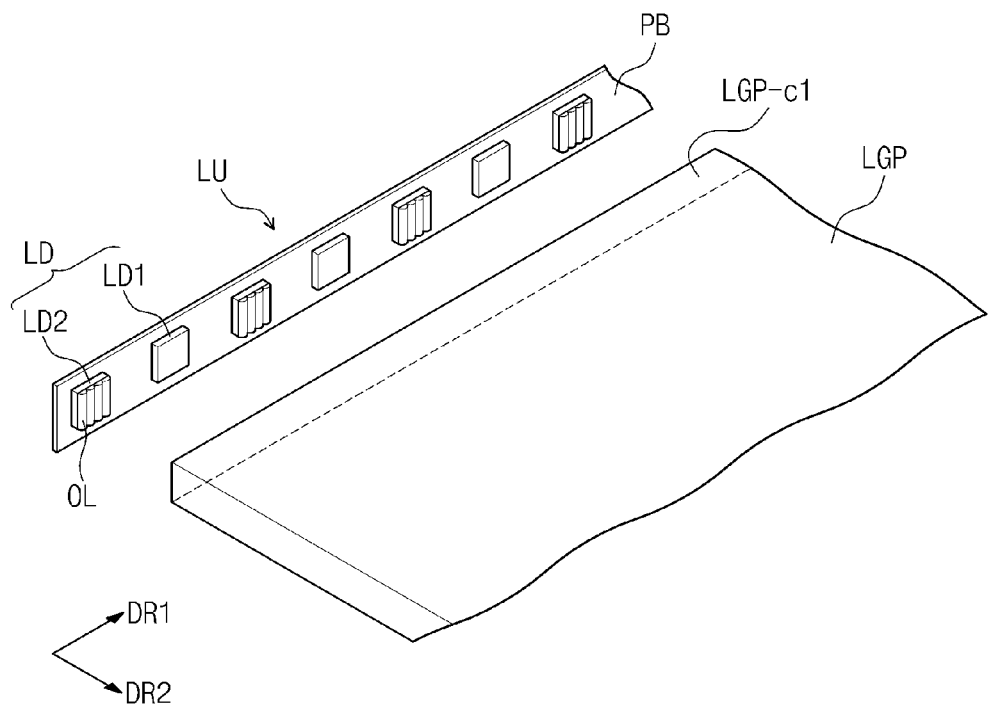
FIG. 2 is a perspective view illustrating an arrangement of a light guide part, a light source part, and an optical member according to an embodiment of the inventive concept.
Figure 3:
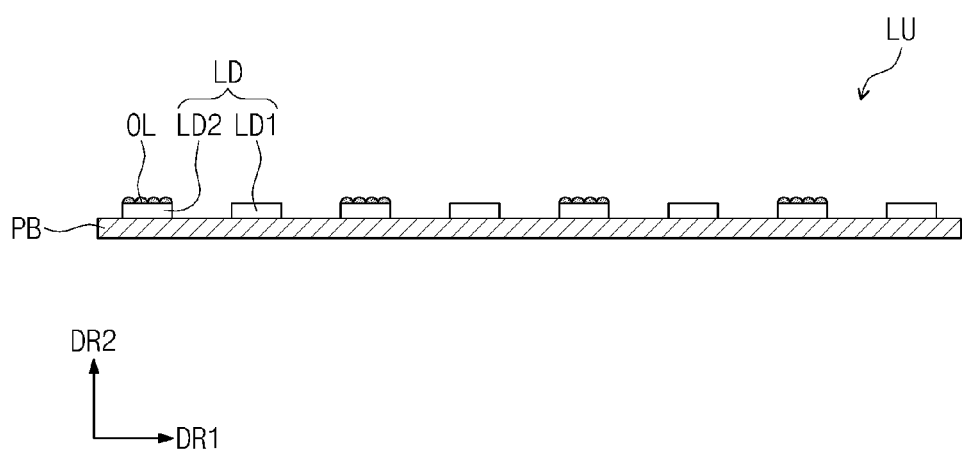
FIG. 3 is a side view of an embodiment of the light source part and the optical member according to the inventive concept.

FIG. 2 is a perspective view illustrating a portion of the backlight unit BLU including the light guide part, the light source part, and an optical member disposed on the light source part in the display apparatus according to an embodiment, and FIG. 3 is a view illustrating a side surface of the light source part LU of FIG. 2.

Referring to FIG. 2, an embodiment of the light source part LU may include a circuit board PB and a plurality of light emitting device packages LD disposed, e.g., mounted, on the circuit board PB. Referring to FIGS. 2 and 3, the plurality of light emitting device packages LD may be arranged, e.g., linearly, in the first direction DR1 that is an extension direction of the light incident surface LGP-c1 of the light guide part LGP. In such an embodiment, the light emitting device packages LD of the light source part may be disposed to face the light incident surface LGP-c1 of the light guide part LGP. In one embodiment, for example, the light source part LU may be disposed in a way such that the light emitting device packages LD may be disposed between the circuit board PB and the light incident surface LGP-c1 of the light guide part LGP, as shown in FIG. 2.

The circuit board PB of the light source part LU may provide power to the plurality of light emitting device packages LD disposed thereon. In one embodiment, for example, the circuit board PB may provide a dimming signal and a driving voltage to the plurality of light emitting device packages LD disposed thereon.

The circuit board PB may include an insulation layer (not shown) and a circuit layer (not shown). In one embodiment, for example, the circuit board PB may be a metal core printed circuit board ("MCPCB").

The plurality of light emitting device packages LD of the light source part LU may include a first light emitting device package LD1 and a second light emitting device package LD2, which generate light having wavelengths different from each other. In an embodiment, the second light emitting device package LD2 may emit light having a wavelength that is longer than that of light emitted by the first light emitting device package LD1.

In one embodiment, for example, the first light emitting device package LD1 may emit a blue light, and the second light emitting device package LD2 may emit a magenta light. In one alternative embodiment, for example, the first light emitting device package LD1 may emit a blue light, and the second light emitting device package LD2 may emit one of a green light and a red light.

However, the embodiments of the inventive concept are not limited thereto. In another alternative embodiment, for example, the first light emitting device package of the light source part may emit a blue light, and the second light emitting device package may include a light emitting device package that emits a green light and a light emitting device package that emits a red light.

In an embodiment, although not shown, the display apparatus 100 may further include a quantum dot sheet. In one embodiment, for example, where the first light emitting device package emits the blue light and the second light emitting device package emits the red light, the quantum dot sheet may emit a green light. In such an embodiment, the quantum sheet may be disposed on the light guide part LGP.

However, the embodiment of the inventive concept is not limited thereto. In one embodiment, for example, the combination of the first and second light emitting device packages and the quantum dot sheet may be various changed in a way such that white light is supplied to the display panel.

The first light emitting device package LD1 and the second light emitting device package LD2 may be alternately disposed on the circuit board. However, the embodiment of the inventive concept is not limited thereto.

Referring to FIG. 2, each of the light emission surfaces of the first and second light emitting device packages LD1 and LD2 may face the light incident surface LGP-c1 of the light guide part LGP.

In one embodiment, for example, the plurality of light emitting device packages may emit light in the second direction DR2 to the light guide part LGP, e.g., to the light incident surface LGP-c1 of the light guide part LGP. The light emission surface of the light emitting device package may be parallel to a surface of the circuit board PB on which the light emitting device packages are disposed. In such an embodiment, each of the plurality of light emitting device packages may be a top emission-type light emitting device package that emits light upwardly.

In an embodiment of the display apparatus, the optical member may be disposed on a light emitting device package of the first and second light emitting device packages of the light source part. Referring to FIGS. 2 and 3, an optical member OL may be disposed on the second light emitting device package LD2 that generates light having a relatively long wavelength.

Figure 4:
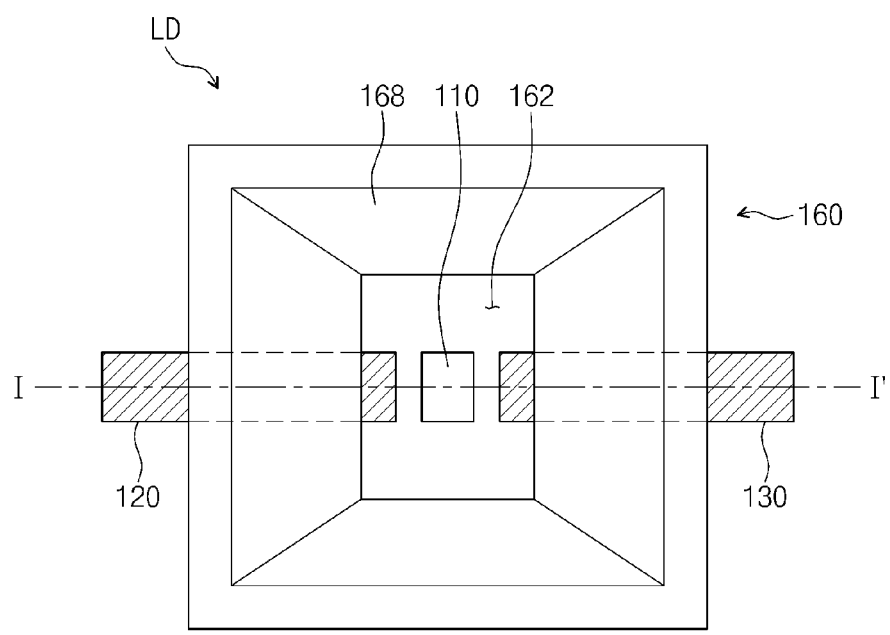
FIG. 4 is a plan view of an embodiment of a light emitting device package according to the inventive concept.
Figure 5:
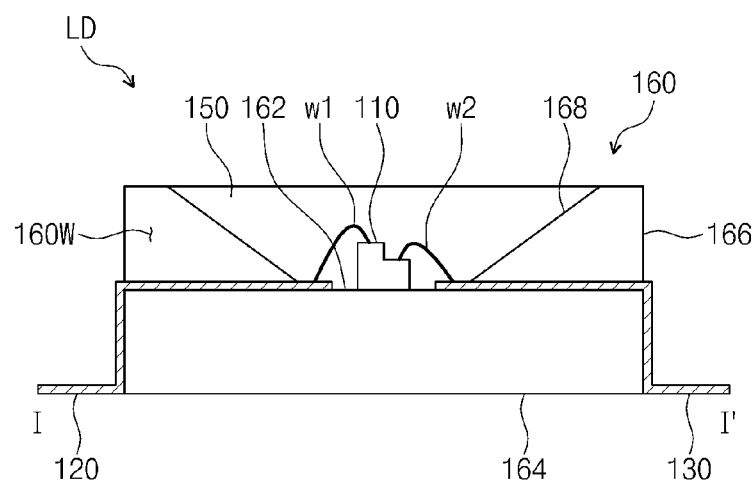
FIG. 5 is a cross-sectional view of the light emitting device package, taken along line I-I' of FIG. 4.
Figure 6:
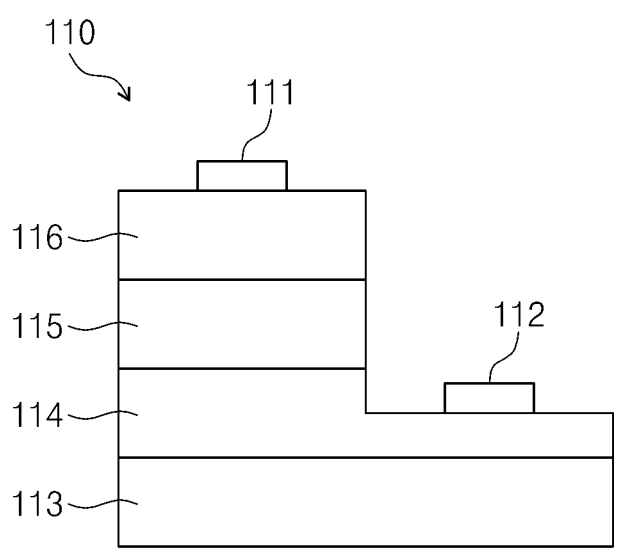
FIG. 6 is a cross-sectional view of the light emitting device of the light emitting device package of FIG. 4.

The light emitting device packages LD and the optical member OL selectively disposed on the light emitting device packages LD of an embodiment of the display apparatus will be described in detail with reference to FIGS. 4 and 6. FIGS. 4 to 6 are detailed views of the light emitting device package of the display apparatus according to an embodiment.

FIG. 4 is a plan view of the light emitting device package LD according to an embodiment, and FIG. 5 is a cross-sectional view taken along line I-I' of FIG. 4. FIG. 6 is a cross-sectional view of a light emitting device 110 of the light emitting device package according to an embodiment. Referring to FIGS. 4 to 6, an embodiment of the light emitting device package LD may include the light emitting device 110, a pair of lead frames 120 and 130, and a body part 160.

The light emitting device 110 generates light in response to a driving voltage applied through a first electrode and a second electrode. The light emitting device 110 may have a structure in which an n-type semiconductor layer, an active layer, and a p-type semiconductor layer are sequentially stacked one on another. When the driving voltage is applied, electrons and holes may be coupled again to each other while moving to generate light.

FIG. 6 is a view illustrating an embodiment of a light emitting device of the light emitting device package of FIG. 4. In an embodiment, as illustrated in FIG. 6, the light emitting device 110 may include an n-type semiconductor layer 114, an active layer 115, and a p-type semiconductor layer 116, which are sequentially or successively stacked on a substrate 113. In such an embodiment, the light emitting device 110 may include a p-type electrode 111 (hereinafter, referred to as a first electrode) connected to the p-type semiconductor layer 116 and an n-type electrode 112 (hereinafter, referred to as a second electrode) connected to the n-type semiconductor layer 114.

The substrate 113 may include or be formed of a transparent material including sapphire. Alternatively, the substrate 113 may include or be formed of a material such as zinc oxide (ZnO), gallium nitride (GaN), silicon carbide (SiC), and aluminum nitride (AlN).

In an embodiment, the n-type semiconductor layer 114 may include an n-type nitride semiconductor layer such as GaN or GaN/AlGaN doped with an n-type conductive impurity. Alternatively, the p-type semiconductor layer 116 may include a p-type nitride semiconductor layer such as GaN or GaN/AlGaN doped with a p-type conductive impurity. In an embodiment, the active layer 115 may include an InGaN/GaN layer having a multi quantum well ("MQW") structure.

When portions of the p-type semiconductor layer 116 and the active layer 115 are removed through mesa etching, a portion of a top surface of the n-type semiconductor layer 114 may be exposed to the outside. In an embodiment, the first electrode 111 may be disposed on the p-type semiconductor layer 116, and the second electrode 112 may be disposed on a portion of the n-type semiconductor layer 114 that is exposed to the outside through the mesa etching.

The first lead frame 120 may be connected to the first electrode 111 of the light emitting device 110, and the second lead frame 130 may be connected to the second electrode 112 of the light emitting device 110. The driving voltage applied from the outside may be provided to the light emitting device 110 through the first lead frame 120, and the dropping driving voltage may be outputted through the second lead frame 130. In such an embodiment of the light emitting device 110, a first voltage may be provided to the first electrode 111 through the first lead frame 120, and a second voltage having a potential less than that of the first voltage may be provided to the second electrode 112 through the second lead frame 130. Here, a difference in potential of the first and second voltages may be equal to a level of the dropping driving voltage.

The light emitting device 110 is disposed on the body part 160, and the body part 160 fixes the first and second lead frames 120 and 130 disposed therethrough. The body part 160 may include or be formed of a polymer resin.

In an embodiment, as illustrated in FIGS. 4 and 5, the body part 160 may include a mounting surface 162 on which the light emitting device 110 is mounted, a bottom surface 164 facing the mounting surface 162, and an outer surface bent from the bottom surface 164 to extend upwardly.

IN an embodiment, the body part 160 may have a cavity. The cavity may be a space that is defined by a partition wall 160W disposed to surround the light emitting device 110 and the mounting surface 162 on which the light emitting device is mounted. In such an embodiment, the cavity defined in the body part 160 may be a space that is defined by the mounting surface 162 and the inner surface 168 bent from the mounting surface 162 to obliquely extend upwardly.

The light emitting device 110 may be disposed in the cavity of the body part 160. The light emitting device 110 may be fixed and disposed on the mounting surface 162 within the cavity of the body part 160 by using an adhesion member (not shown). In an embodiment, the adhesion member (not shown) may include a resin-based adhesion sheet, a conductive adhesion sheet, a polymer resin adhesive or a conductive adhesive.

A molding part 150 filled to surround the light emitting device 110 may be disposed in the cavity. The molding part 150 may protect the light emitting device 110. In an embodiment, the molding part may include a phosphor material together with a base resin. In such an embodiment, an epoxy resin or an acrylic resin may be used as the base resin.

The phosphor material may include a red phosphor, a yellow phosphor, or a green phosphor. However, embodiments are not limited thereto. In one embodiment, for example, the phosphor material may selectively include phosphor materials that are capable of being excited by light emitted from the light emitting device 110.

In an embodiment, each of the first and second lead frames 120 and 130 may pass through a portion of the body part 160. In such an embodiment, each of the first and second lead frames 120 and 130 may have one end exposed to the mounting surface 162 and the other end extending from the one end to protrude from the body part 160.

In one embodiment, for example, as illustrated in FIGS. 4 and 5, where the first and second lead frames 120 and 130 passes through the partition wall 160W, the another end extending from the one end may protrude from the outer surface 166.

In an embodiment, the first electrode 111 and the one end of the first lead frame 120, which is exposed to the mounting surface 162 may be connected to each other by a first wire w1, and the second electrode 112 and the one end of the second lead frame 130 may be connected to each other by a second wire w2. The above-described connection method is merely exemplary. In an alternative embodiment, where the light emitting device has a structure different from that shown in FIG. 6, the lead frames 120 and 130 and the electrodes 111 and 112 may be respectively connected to each other through other connection methods.

Figure 7A:
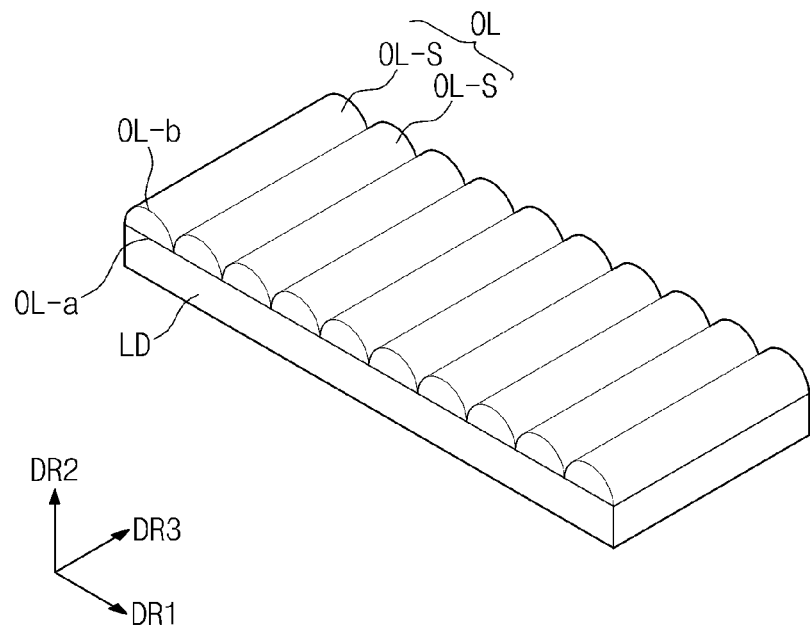
FIGS. 7A to 7C are views of embodiments of an optical member disposed on the light emitting device package according to the inventive concept.
Figure 7B:
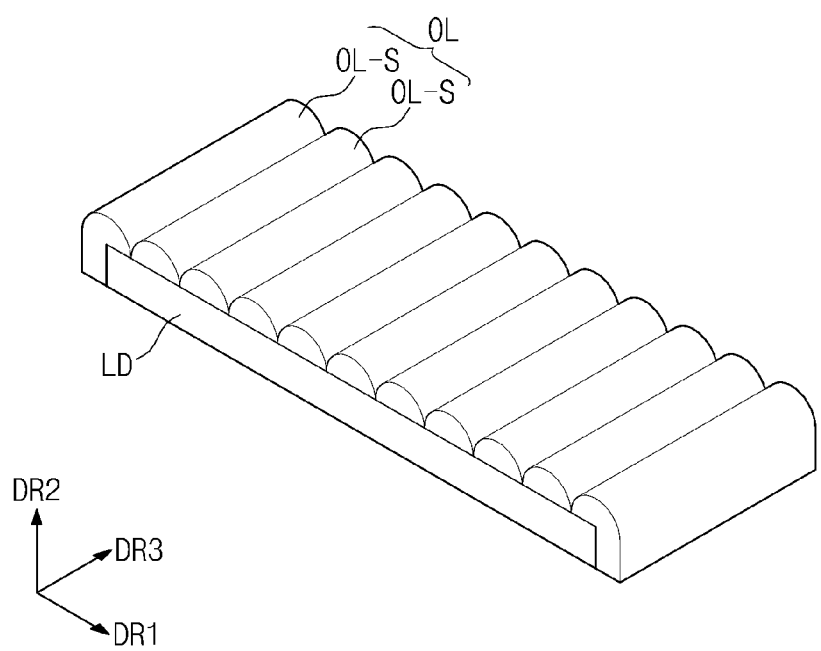
Figure 7C:
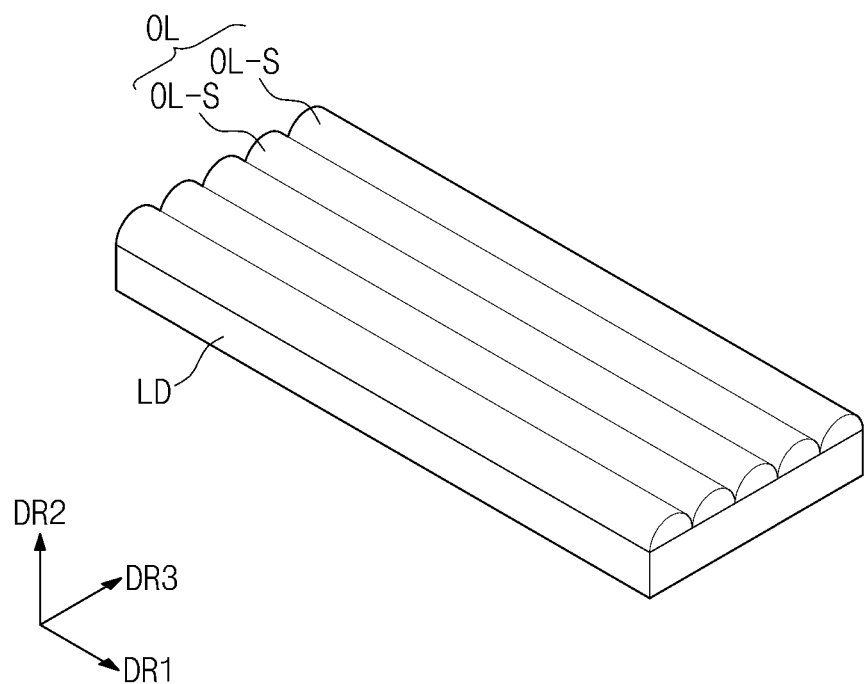

FIGS. 7A to 7C are perspective views of various embodiments of the optical member OL disposed on the light emitting device package LD according to the inventive concept. In such embodiments, the optical member OL may include a plurality of rod-type lenses OL-S extending in a predetermined direction.

Referring to FIG. 7A, in an embodiment, the plurality of rod-type lenses OL-S may include a lens incident surface OL-a facing the light emitting device package LD and a lens emission surface OL-b opposite to the lens incident surface OL-a.

The lens emission surface OL-b may include a curved surface or an inclined surface. The lens emission surface OL-b may extend in a direction in which the plurality of rod-type lenses extends. In one embodiment, for example, as shown in FIGS. 7A and 7B, the lens emission surface OL-b may extend in a third direction DR3, which is a direction parallel to a short side of the light emitting device package LD.

In such an embodiment described with reference to FIGS. 7A and 7B, the rod-type lenses OL-S may be arranged in the first direction DR1, which is perpendicular to the third direction DR3 or a direction parallel to a long side of the light emitting device package LD. In such an embodiment described with reference to FIGS. 7A and 7B, the rod-type lenses OL-S may be disposed adjacent to each another.

Referring to FIG. 7A, in an embodiment, the plurality of rod-type lenses OL-S may be disposed on the top surface of the light emitting device package LD. In an alternative embodiment, referring to FIG. 7B, the plurality of rod-type lenses OL-S may be disposed to surround the side surface of the light emitting device package as well as the top surface of the light emitting device package. In such an embodiment, the optical member may be disposed to surround the molding part of the light emitting device package, the top surface of the body part, and the side surface of the body part.

In another alternative embodiment, as shown in FIG. 7C, the plurality of rod-type lenses disposed on the light emitting device package LD may be arranged in the third direction DR3.

The arrangement of the optical member and the light source part of the light source part LU described above with reference to FIG. 2 may have at least one of those described above with reference to FIGS. 7A to 7C. In one embodiment, for example, the arrangement of the optical member and the light source part have the arrangement shown in FIGS. 7A and 7B to disperse or collect light in the extending direction of the light incident surface of the light guide part. In such an embodiment, since the rod-type lenses of the optical member are arranged in the first direction DR1 that is the extending direction of the light incident surface of the light guide part, the light emitted from the light emitting device package may be dispersed or collected in the first direction by the shape of the rod-type lenses.

In an alternative embodiment, the display apparatus may have the arrangement of the optical member and the light source part shown in FIG. 7C to allow the light emitted from the light emitting device package LD to be incident corresponding to the light incident surface of the light guide part, but the upper or lower portion of the light incident surface of the light guide part. In such an embodiment, where the optical member is arranged as shown in FIG. 7C, the light may be easily collected in a height direction of the light incident surface, i.e., the third direction DR3.

Although the plurality of rod-type lenses OL-S disposed on the light emitting device package LD may be arranged as shown in FIGS. 7A to 7C in some embodiments, the embodiments of the inventive concept are not limited thereto. In one alternative embodiment, for example, the number of the rod-type lenses of the optical member may be variously modified.

Figure 8A:
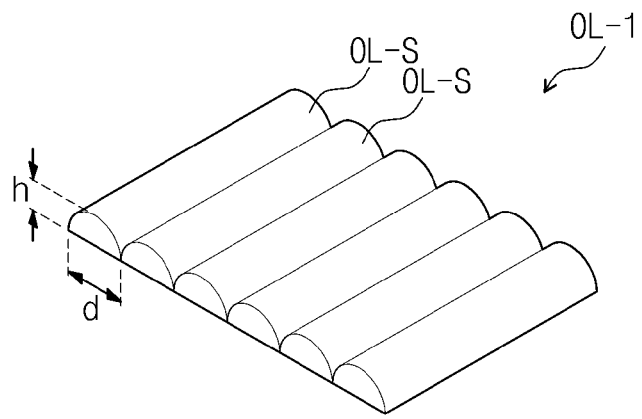
FIGS. 8A to 8C are perspective views of embodiments of the optical member according to the inventive concept.
Figure 8B:
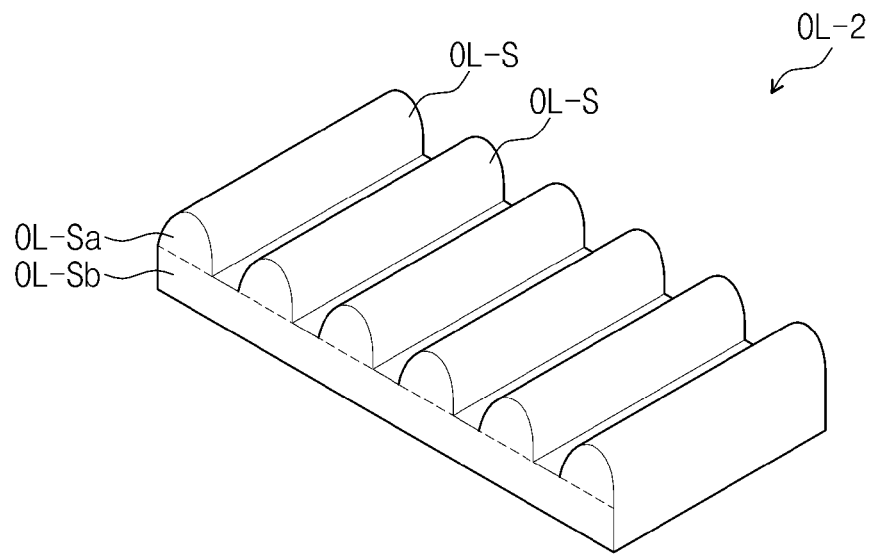
Figure 8C:
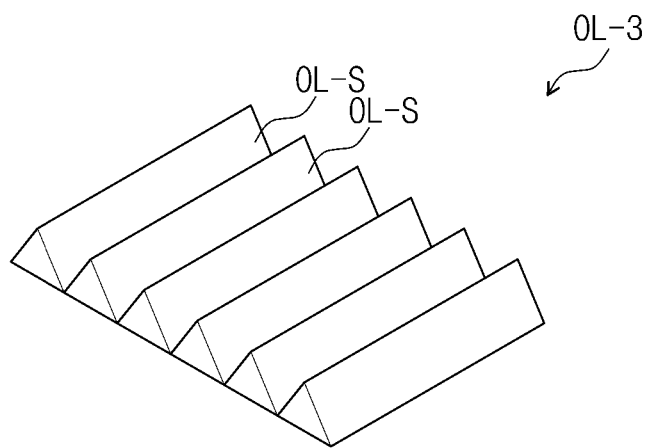

FIGS. 8A to 8C are views of various embodiments of the optical member OL-1, OL-2, and OL-3. Referring to FIGS. 8A to 8C, an embodiment of an optical member may include a plurality of rod-type lenses OL-S having a length in one direction, which is longer than that in the other direction thereof.

In an embodiment of the optical member OL-1, as shown in FIG. 8A, each of the rod-type lenses OL-S may have a semicircular or semielliptical cross-sectional shape in a transverse direction perpendicular to the extension direction thereof. In one embodiment, for example, as shown in FIG. 8A, the cross-sectional shape of each of the rod-type lenses OL-S may have a semielliptical shape having a width (d) and a height (h).

In an embodiment, as shown in FIG. 8A, a ratio of the width (d) to the height (h) of the rod-type lens may be adjusted to adjust optical characteristics of the optical member. In one embodiment, for example, where the height (h) is relatively greater than the width (d), the optical member may have a light collection effect. In an alternative embodiment, where the height (h) is relatively less than the width (d), the optical member may have a light dispersion effect.

In an alternative embodiment, as shown in FIG. 8B, the optical member OL-2 may include a plurality of rod-type lenses OL-S, and each of the rod-type lenses OL-S may include a base OL-Sb and a protrusion OL-Sa disposed on the base OL-Sb. In such an embodiment, as shown in FIG. 8B, the protrusions OL-Sa of the plurality of rod-type lenses may be disposed to be spaced apart from one another on the base OL-Sb. In such an embodiment, the rod-type lens including the base OL-Sb and the protrusion OL-Sa may improve the light collection effect. In an alternative embodiment, the optical member including only the base OL-Sb may have relatively low light collection efficiency.

Referring to FIG. 8C, in another alternative embodiment, each of the rod-type lenses OL-S may have a triangular cross-sectional shape. The rod-type lens OL-S having the triangular section may have the light collection effect, like the prism pattern.

In an embodiment, as described above, the optical member disposed on the light emitting device package of the light source part includes the plurality of rod-type lenses, each of which has a semicircular, semielliptical, or triangular cross-sectional shape to change a traveling direction of light emitted from the light emitting device package. However, the embodiment of the inventive concept is not limited thereto. In one embodiment, for example, the optical member may have a polygonal cross-sectional shape or a shape in which the lens emission surface has a curved portion.

In an embodiment, the rod-type lenses of the optical member may be directly provided or formed on light emitting device package. In one embodiment, for example, the rod-type lenses may be formed by directly dispensing a resin onto the light emitting device package. In such an embodiment, a thixotropic resin may be used as the resin to maintain a shape of the lens. In one embodiment, for example, the resin may have viscosity of about 50,999 centipoise (cP) or more. The optical member may include or be formed of an acrylic resin or an epoxy resin.

In an embodiment, where the rod-type lens is formed through the dispensing, the pattern of the rod-type lens may be adjusted by the viscosity of the resin and a pressure or speed of a resin supply device for dispensing the resin. In such an embodiment, the pattern may be changed according to a shape and size of a nozzle that is used for dispensing the resin.

In one embodiment, for example, when the rod-type lens has the semicircular or semielliptical cross-sectional shape, the lens incident surface that contacts the light emitting device package may have a maximum width (d) of about 10 micrometers (μm) to about 200 μm. In one embodiment, for example, when the lens incident surface has a maximum width (d) of about 10 μm or less on the pattern of the rod-type lens, it may be difficult to directly form the pattern of the lens through the nozzle. In such an embodiment, when the lens incident surface has a maximum width (d) of about 200 μm or more, an effect for adjusting a view angle of the light emitted from the light emitting device package may be small.

The pattern of the rod-type lens may have a size that is changed according to the shape and size of the used light emitting device package. In one embodiment, for example, the light emitting device package LD shown in FIG. 7A may have a rectangular plane with a size of about 7 millimeters (mm) in the first direction DR1 and a size of about 2 mm in the third direction DR3. In such an embodiment, one hundred thirty rod-type lenses, each of which has a maximum width (d) of about 50 μm on the section may be arranged on the light emitting device package in the first direction DR1.

In an embodiment, where the rod-type lens of the optical member is directly formed on the light emitting device package through the dispensing, the limitation such as the introduction of the foreign substance, which may occur when a separate optical member is attached after being manufactured, may effectively be prevented. In such an embodiment, since the pattern of the lens is formed by directly dispensing the resin, a shape that is adequate for the optical use may be selectively formed.

Figure 9A:
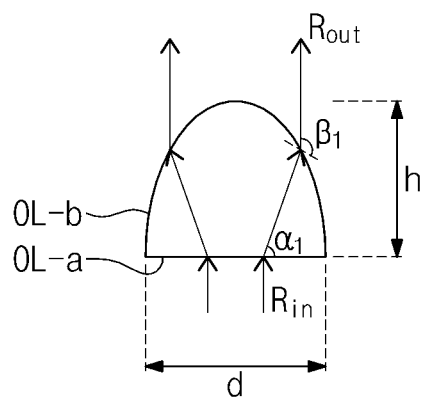
FIGS. 9A and 9B are views illustrating light extraction in an embodiment of the optical member according to the inventive concept.
Figure 9B:
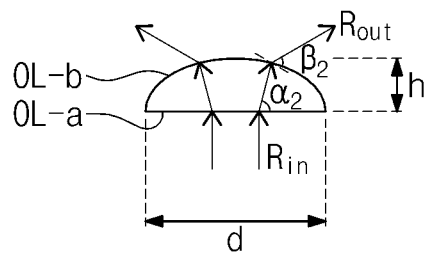

FIGS. 9A and 9B are views illustrating a light emission direction in the rod-type lens of the optical member of FIG. 8A, which has the semielliptical cross-sectional shape. In such an embodiment, as shown in FIG. 9A, the optical member may adjust so that a view angle of light emitted from the lens emission surface OL-b of the rod-type lens is less than that of light incident into the lens incident surface OL-a of the rod-type lens form the light emitting device package.

In one embodiment, for example, referring to FIG. 9A, when light $R_{in}$ incident into the lens incident surface OL-a of the optical member has an incident angle α1, light $R_{out}$ emitted from the lens emission surface OL-b has an emission angle β1, the incident angle α1 and the emission angle β1 may satisfy the following inequation: α1<β1. As illustrated in FIG. 9A, when the cross-sectional shape of the rod-type lens in the light emission direction has a maximum width (d) in a direction parallel to the lens incident surface and a height (h) in a normal direction of the lens incident surface, a ratio of the height (h) to the maximum width (d) may satisfy the following in such an embodiment: h/d≥1.

In an alternative embodiment, referring to FIG. 9b, when the light $R_{in}$ incident into the rod-type lens from the light emitting device package is emitted from the lens emission surface OL-b through the rod-type lens, a view angle of the emission light $R_{out}$ may be greater than that of the incident light. In one embodiment, for example, referring to FIG. 9B, when the light $R_{in}$ incident into the lens incident surface OL-a of the optical member has an incident angle $α_2$, and the light $R_{out}$ emitted from the lens emission surface OL-b has an emission angle β2, the incident angle $α_2$ and the emission angle $β_2$ may satisfy the following inequation: $α_2>β_2$. In such an embodiment, the cross-sectional shape of the rod-type lens has a maximum width (d) in the direction parallel to the lens incident surface and a height (h) in the normal direction of the lens incident surface. In such an embodiment, as shown in FIG. 9B, a ratio of the height (h) to the maximum width (d) may satisfy the following inequation: h/d≥9.

In such an embodiment, as described above, the optical member may be disposed on the light emitting device package of the light source part to adjust the view angle of the light that is transferred from the light source part to the light guide part. In such an embodiment, the view angle of the light emitted from the light emitting device package of the light source part may be adjusted based on the shape of the rod-type lens of the optical member.

Figure 10A:
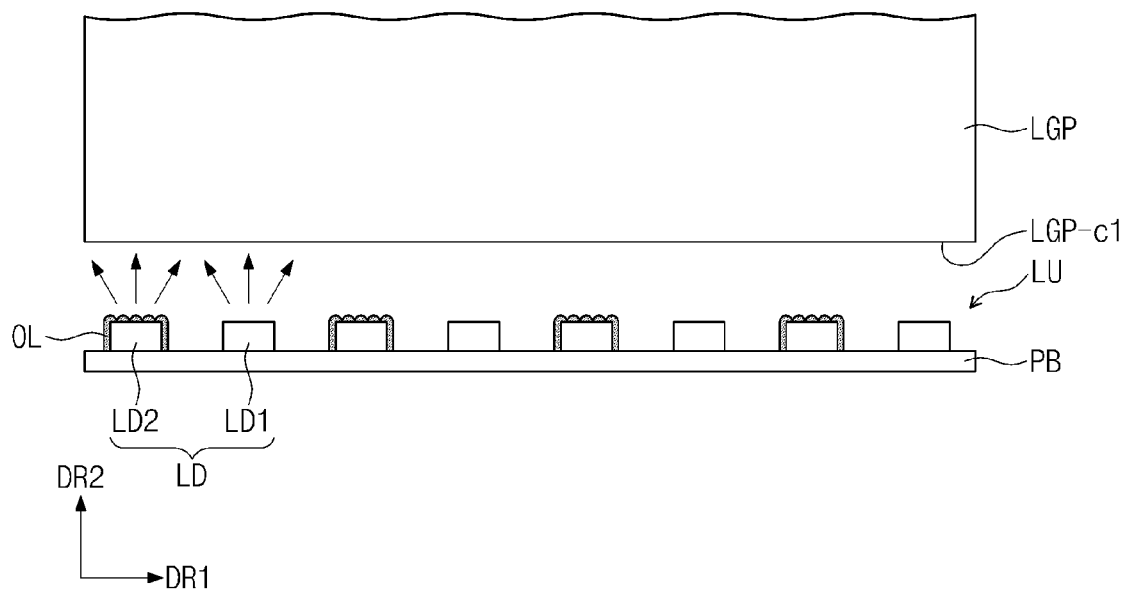
FIG. 10A is a side view illustrating an arrangement of the light guide part and the light source part according to an embodiment of the inventive concept.
Figure 10B:
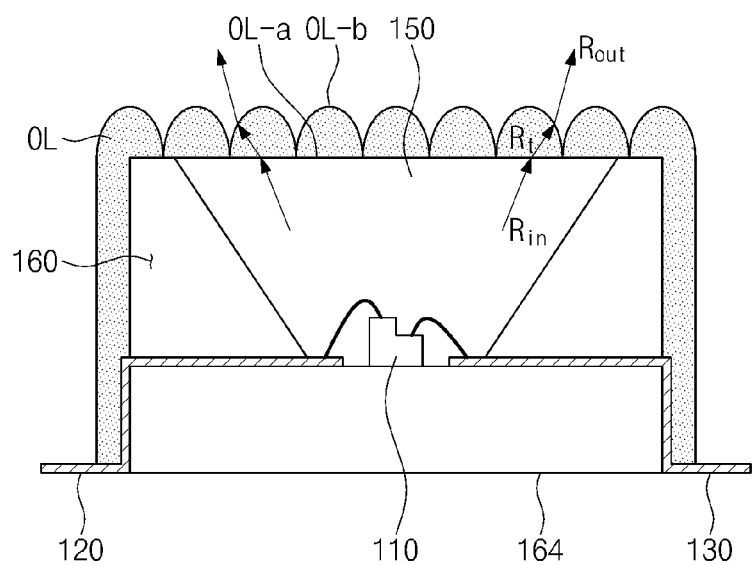
FIG. 10B is a cross-sectional view illustrating an arrangement of the light emitting device package and the optical member in FIG. 10A.

FIG. 10A is a view illustrating an arrangement of the light guide part LGP, the light source part LU, and the optical member OL according to an embodiment, and FIG. 10B is a view illustrating a light extraction path in a second light emitting device package LD2 on which the optical member OL is disposed.

In an embodiment, as shown in FIG. 10A, the light source part LU may be disposed to face the light incident surface LGP-c1 of the light guide part LGP. The light source part LU may include a first light emitting device package LD1 and a second light emitting device package LD2, which generate light having wavelengths different from each other to emit the light to the light guide part LGP. In one embodiment, for example, the second light emitting device package LD2 may generate light having a wavelength that is longer than that of light generated by the first light emitting device package LD1.

Referring to FIGS. 10A and 10B, the optical member OL including the plurality of rod-type lenses may be disposed on the second light emitting device package LD2. In one embodiment, for example, the optical member OL may surround a molding part 150 of the second light emitting device package LD2, a top surface of the body part 160, and a side surface of the body part 160 and be disposed on the second light emitting device package LD2.

Referring to FIG. 10B, light generated from the light emitting device 110 may pass through the molding part 150 and then be incident $R_{in}$ into the lens incident surface OL-a of the optical member OL and then be transmitted $R_t$ through the inside of the rod-type lens and emitted $R_{out}$ from the lens emission surface OL-b. The light passing through the optical member OL may be further collected to an upper side of the second light emitting device package LD2 than an angle of the light and then be emitted.

In such an embodiment shown in FIGS. 10A and 10B, the second light emitting device package LD2 may emit light having a relatively long wavelength when compared to that of the first light emitting device package LD1. In one embodiment, for example, the first light emitting device package LD1 may generate a blue light, and the second light emitting device package LD2 may generate a magenta light. Here, the optical member OL may be disposed on the second light emitting device package LD2 that generate the magenta light. The optical member OL may reflect the magenta light emitted from the second light emitting device package LD2 at an angle that is greater than that at which the light is incident into the optical member OL to reduce a dispersion angle of the light incident into the light guide part LGP. In such an embodiment, the dispersion angle of the light may be reduced so that the more amount of collected light than that of light emitted from the light emitting device package before passes through the optical member OL is incident into the light guide part LGP.

Thus, in an embodiment of the display apparatus, the optical member may be selectively disposed on only the second light emitting device package from which the light is relatively dispersed and emitted. In an embodiment, where the optical member is disposed on only the second light emitting device package, the light emitted from the first light emitting device package may be incident into the light guide part at a view angle that is similar to that of the light emitted from the second light emitting device package through the optical member. Thus, in an embodiment, where the light having the wavelengths different from each other, which are emitted from the first and second light emitting device packages, are incident into the light guide part at the view angles similar to each other, the light supplied into the display panel through the light guide part may be supplied as the uniform white light.

In an embodiment of the display apparatus, the optical member may be disposed on the second light emitting device package from which light having a relatively long wavelength is emitted to reduce the view angle of the light emitted from the second light emitting device package. When the light emitting device package emits the light having the relatively long wavelength, the light may have an incident angle and refraction angle that are less than those of light emitted from the light emitting device package that emits light having a relatively short wavelength when the light passes through media having refraction indexes different from each other. Thus, the optical member may be disposed on only the light emitting device package emitting the light having the relatively long wavelength to change the refraction angle of the emitted light.

In one embodiment, for example, when the second light emitting device package generates the magenta light, the second light emitting device package may include the light emitting device that emits the blue light and the red phosphor that is excited by the blue light on the molding part.

In an alternative embodiment, the first light emitting device package may emit the blue light, and the second light emitting device package may emit the red light. In such an embodiment, the quantum dot sheet that emits the green light may be further disposed on the light guide part to allow the backlight unit to supply the white light to the display panel.

Figure 11:
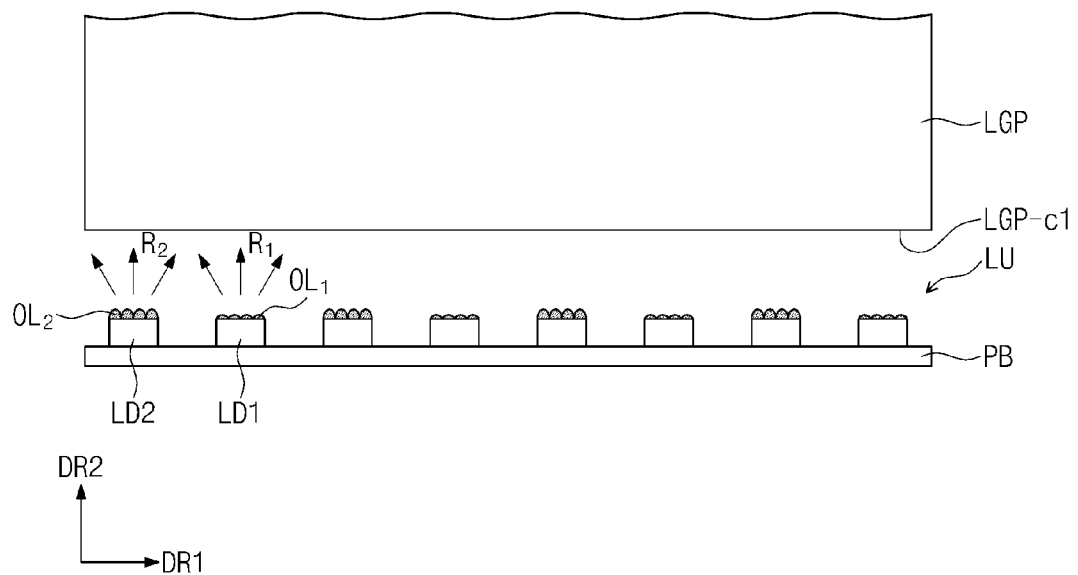
FIG. 11 is a side view illustrating an arrangement of the light guide part, the light source part, and the optical member according to an alternative embodiment of the inventive concept.

FIG. 11 is a view of a structure in which an optical member is disposed on first and second light emitting device packages, according to another embodiment. In an embodiment, as shown in FIG. 11, optical members OL different from each other may be respectively disposed on a first light emitting device package LD1 and a second light emitting device package LD2. In one embodiment, for example, a first optical member OL1 may be disposed on the first light emitting device package LD1, and a second optical member OL2 may be disposed on the second light emitting device package LD2.

In an embodiment, where the second light emitting device package LD2 emits light having a relatively long wavelength than that of light emitted from the first light emitting device package LD1, the second optical member OL2 disposed on the second light emitting device package LD2 may reduce a view angle of light incident thereinto. In such an embodiment, the first optical member OL1 disposed on the first light emitting device package LD1 may increase the view angle of the light incident thereinto.

Thus, in an embodiment, the optical member may be selectively disposed according to a wavelength of light emitted from the light emitting device package to adjust the view angle of the light so that the light supplied to the light guide part through the optical member has an uniform view angle.

In one embodiment, for example, when a lens incident surface of each of a plurality of rod-type lenses of the optical member has a maximum width (d) and a maximum height (h) in a normal direction of the lens incident surface, the rod-type lenses that satisfy the following inequation: h/d<1 may be disposed on the first light emitting device package. Also, the plurality of rod-type lenses that satisfy the following inequation: h/d≥1 may be disposed on the second light emitting device package.

In an embodiment shown in FIG. 11, an incident angle of light $R_1$ that is incident into the light guide part LGP through the first optical member OL1 after being generated in the first light emitting device package LD1 may be substantially the same as that of light $R_2$ that is incident into the light guide part LGP through the second optical member OL2 after being generated in the second light emitting device package LD2.

In such an embodiment, the optical member having a light diffusion function may be disposed on the first light emitting device package that emits light having a relatively short wavelength, and the optical member having a light collection function may be disposed on the second light emitting device package that emits light a relatively long wavelength. Thus, in such an embodiment, the optical members are selectively disposed in a way such that the light having the uniform view angle may be supplied from the first and second light emitting device packages to the light guide part.

Hereinafter, an alternative embodiment of a display apparatus will be described with reference to FIGS. 12A to 13. The same or like elements shown in FIGS. 12A to 13 have been labeled with the same reference characters as used above to describe the embodiments of the display apparatus shown in FIGS. 2 to 11, and any repetitive detailed description thereof will hereinafter be omitted or simplified.

In an alternative embodiment, the display apparatus may include a display panel and a backlight unit that provides light to the display panel. In such an embodiment, the backlight unit may include a light guide part, a light source part, and an optical member. The light guide part may have a light emission surface, a reflection surface facing the light emission surface, and connection surfaces connecting the light emission surface to the reflection surface.

The light source part may be disposed to face a light incident surface of the light guide part. The light source part may include a circuit board, a third light emitting device package disposed on a central area of the circuit board, and a fourth light emitting device package disposed on a peripheral area of the circuit board.

Figure 12A:
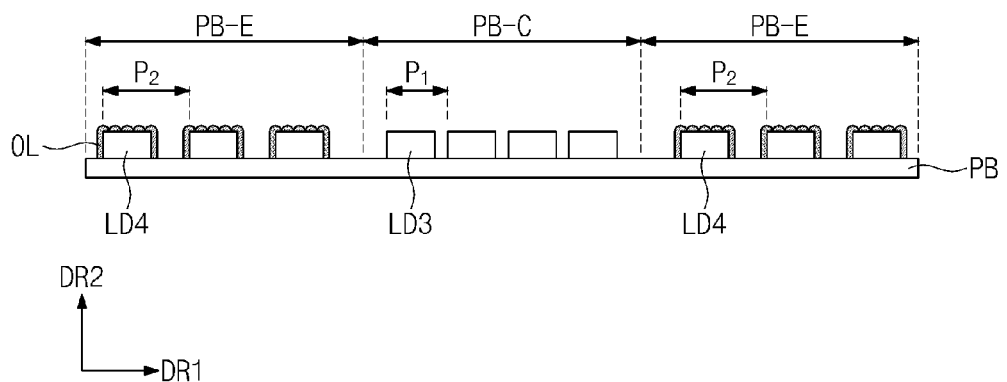
FIG. 12A is a side view illustrating an arrangement of the light source part and the optical member according to an embodiment of the inventive concept.
Figure 12B:
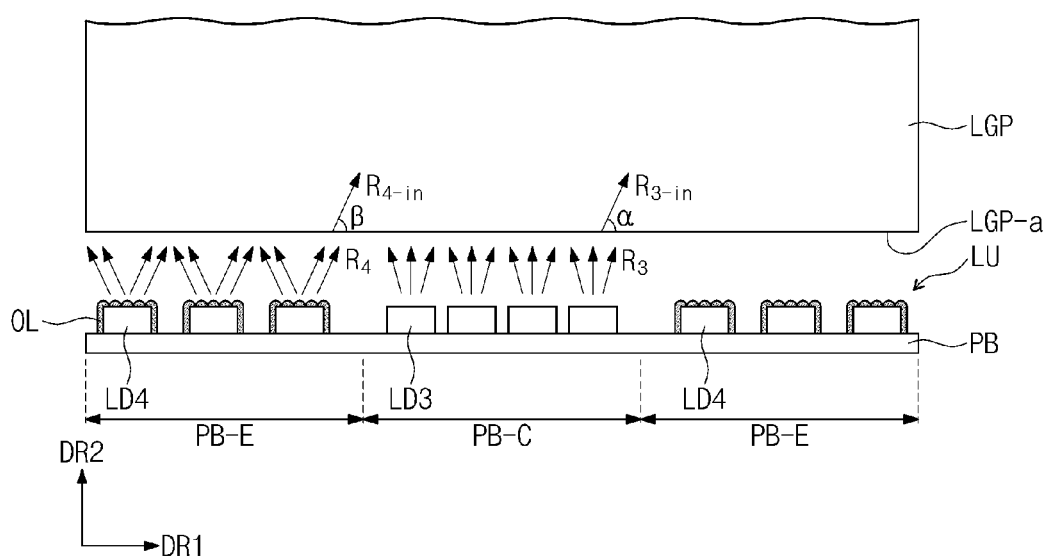
FIG. 12B is a side view illustrating an arrangement of the light source part and the light guide part of FIG. 12A according to an embodiment of the inventive concept.
Figure 13:
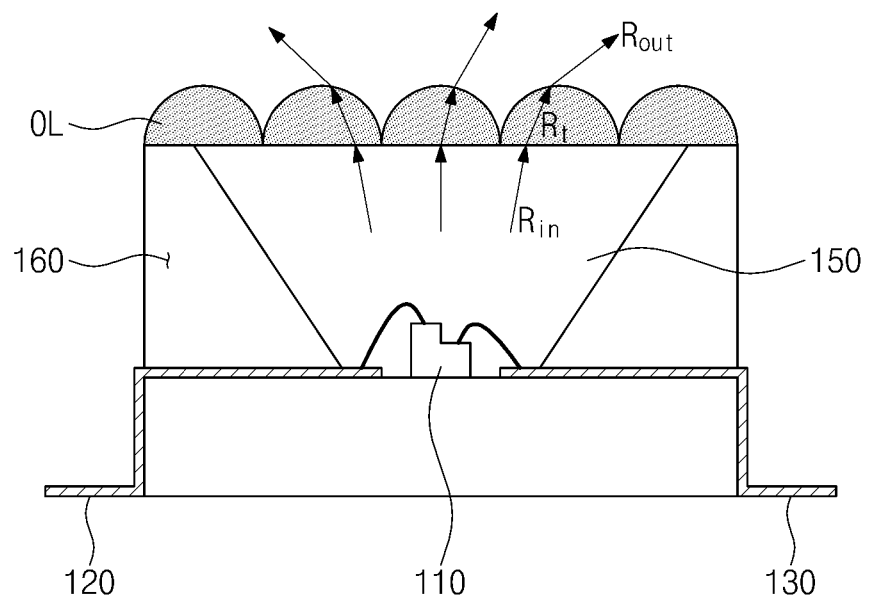
FIG. 13 is a cross-sectional view illustrating an arrangement of the light emitting device package and the optical member of FIG. 12B.

FIG. 12A is a view of the light source part and the optical member of an alternative embodiment of the display apparatus. FIG. 12B is a view illustrating an arrangement of the light source part, the light guide part, and the optical member of FIG. 12A.

In such an embodiment shown in FIGS. 12A and 12B, a light source part LU may include third light emitting device packages LD3 disposed at a first distance $P_1$ on a central area PB-C of a circuit board PB and fourth light emitting device packages LD4 disposed at a second distance $P_2$ on a peripheral area PB-E of the circuit board PB. In such an embodiment, the first distance $P_1$ may be greater than the second distance $P_2$.

In such an embodiment, the plurality of light emitting device packages LD3 and LD4 may be arranged on the light source part in a first direction DR1. In such an embodiment, the spaced distance between the light emitting device packages on the central area PB-C of the circuit board PB may be less than that between the light emitting device packages on the peripheral area PB-E of the circuit board PB.

In an embodiment, the optical member OL may be disposed on the fourth light emitting device package LD4 disposed on the peripheral area PB-E of the circuit board. The third light emitting device package LD3 disposed on the central area PB-C of the circuit board PB and the fourth light emitting device package LD4 disposed on the peripheral area PB-E of the circuit board PB may be light emitting device packages that emit light having the same wavelength. In one embodiment, for example, the third and fourth light emitting device packages may light emitting device packages that emit white light.

Each of the third and fourth light emitting device packages may have the structure that is described with reference to FIGS. 4 to 6. In one embodiment, for example, each of the third and fourth light emitting device packages may include a body part having a cavity, a light emitting device disposed in the cavity, and a molding part disposed to be filled in the cavity.

The light emitting device may be fixedly disposed on a mounting surface of the body part, i.e., a bottom surface of the cavity. The molding part may be disposed to surround the light emitting device and fill the cavity.

In an embodiment, the light emitting device may emit a blue light. In such an embodiment, the molding part may include at least one phosphor that emits the white light by the blue light emitted from the light emitting device.

In one embodiment, for example, the molding part may include a base resin and a phosphor that is dispersed in the base resin. The phosphor may be a yellow phosphor or a mixture of red and green phosphors.

In an embodiment of FIGS. 12A and 12B, the optical member may be disposed on the fourth light emitting device package. In such an embodiment, as described above, the optical member may be disposed on a top surface of the fourth light emitting device package or be disposed to surround the side surface of the fourth light emitting device package in addition to the top surface of the fourth light emitting device package.

IN such an embodiment, the optical member may include a plurality of rod-type lenses. The plurality of rod-type lenses may be disposed on the light emitting device package as illustrated in FIGS. 7A to 7C. In such an embodiment, the optical member may have one of the shapes described above with reference to FIGS. 8A to 8C.

Referring to FIG. 12B, light $R_3$ emitted from the third light emitting device package LD3 and light R4 emitted from the fourth light emitting device package LD4 may be incident into the light incident surface of the light guide part, which faces the light source part. Here, the light $R_4$ emitted from the fourth light emitting device package LD4 may be incident into the light guide part through the optical member OL.

In an alternative embodiment, as shown in FIG. 12B, the optical member OL may be disposed only on the fourth light emitting device package LD4 of the third and fourth light emitting device packages LD3 and LD4 that emit light having the same wavelength so that a view angle of the light emitted from the fourth light emitting device package LD4 is greater than that of light emitted from the third light emitting device package LD3 that does not include the optical member.

In such an embodiment, when light $R_{3\text{-}in}$ incident into the light guide part LGP from the third light emitting device package LD3 has an incident angle $\alpha$, and light $R_{4\text{-}in}$ incident into the light guide part LGP from the fourth light emitting device package LD4 has an incident angle $\beta$, the incident angles a and b may satisfy the following condition: $\alpha > \beta$.

Thus, in case of the fourth light emitting device packages LD4 having the relatively large spaced distance on the circuit board, the optical member may be provided to diffuse the light generated and emitted from the fourth light emitting device package LD4, thereby increasing the view angle of the light.

In such an embodiment, the fourth light emitting device package LD4 including the optical member may supply light in a wider region than the third light emitting device packages LD4 that are disposed at a relatively narrow spaced distance on the central area of the circuit board. In the light source part corresponding to the peripheral area of the display apparatus, the relatively small number of light emitting device packages may be provided to supply light to the wider area of the light incident surface of the light guide part.

In such an embodiment, where the relatively small number of light emitting device packages are disposed on the peripheral area than the central area in the light source part corresponding to the peripheral area of the display panel, the view angle of the light emitted from the light emitting device package may increase by the optical member to reduce a hot spot phenomenon that may occur due to the light emitting device packages spaced apart from each other, thereby uniformly supplying light to the light guide part.

In an embodiment of the display apparatus, as described above, the optical member may be selectively disposed on the light emitting device package of the light source part to adjust the view angle of the light emitted from the light emitting device package.

In one embodiment, for example, the rod-type lens of the optical member may be deformed in shape to collect or diffuse the light emitted from the light emitting device package. In an embodiment, the optical member may be selectively disposed on the light emitting device package of the light source pat so that the light supplied from the light source part is incident into the light incident surface of the light guide part. In such an embodiment, the optical member may control the light so that the light emitted from the light emitting device package is incident into the light incident surface of the light guide part to improve light efficiency. In such an embodiment, the optical member may allow the light emitted from the light emitting device packages that emit light having wavelengths different from each other to be uniformly incident into the light guide part, thereby easily mixing the light having colors different from each other in the light guide part. Thus, the uniformity of the white light that is finally supplied into the display panel may be improved by the light guide part.

In an embodiment, the optical member including the rod-type lens is disposed on the light emitting device package, such that the view angle of light may be adjusted to reduce the hot spot phenomenon caused by light emitted from the light emitting device package.

In an embodiment of the display apparatus according to the inventive concept, the optical member may be disposed on portions of the plurality of light emitting device packages disposed on the light source part. Thus, in such an embodiment, the light emitted from the light emitting device package may be diffused to remove the hot spot phenomenon.

In such an embodiment, the optical member disposed on the light emitting device package may adjust the view angle of the light emitted from the light emitting device package. In such an embodiment, the optical member may improve the incident efficiency of the light supplied from the light source part to the light guide part.

It will be apparent to those skilled in the art that various modifications and variations can be made in the invention. Thus, it is intended that the invention covers the modifications and variations of this invention provided they come within the scope of the appended claims and their equivalents.

Hence, the real protective scope of the inventive concept shall be determined by the technical scope of the accompanying claims.

What is claimed is:

1. A display apparatus comprising:
   a display panel; and
   a backlight unit which provides light to the display panel, wherein the backlight unit comprises:
   a light guide part having a light emission surface, a reflection surface facing the light emission surface, and connection surfaces which connect the light emission surface to the reflection surface;
   a light source part comprising:
   a circuit board;
   a first light emitting device package disposed on the circuit board; and
   a second light emitting device package disposed on the circuit board, wherein the second light emitting device generates light having a longer wavelength than a wavelength of light generated by the first light emitting device package,
   wherein the light source part is disposed to face a light incident surface of the connection surfaces; and
   an optical member comprising a second optical member disposed on the second light emitting device package, wherein the second optical member comprises a plurality of rod-type lenses, and two or more rod-type lenses of the plurality of rod-type lenses are disposed on the second light emitting device package,
   wherein a cross-sectional shape of each of the plurality of rod-type lenses which is parallel to the light emission surface has a maximum width (d) at a lens incident surface thereof which is a planar surface upon which light from the light source part impinges first, and a maximum height (h) in a normal direction of the lens incident surface, and
   wherein a ratio of the maximum height (h) to the maximum width (d) satisfies the following in equation: $h/d \geq 1$.

2. The display apparatus of claim 1, wherein each of the plurality of rod-type lenses comprises:
   the lens incident surface facing the second light emitting device packages; and
   a lens emission surface facing the lens incident surface, wherein the lens emission surface includes a curved surface or an inclined surface.

3. The display apparatus of claim 2, wherein each of the plurality of rod-type lenses has a semicircular, semielliptical or triangular shape at a cross sectional surface which are parallel to the light emission surface.

4. The display apparatus of claim 1, wherein the optical member further comprises:
   a first optical member disposed on the first light emitting device package,
   wherein the first optical member comprises a plurality of rod-type lenses, and two or more rod-type lenses of the plurality of rod-type lenses are disposed on the first light emitting device package,
   a cross-sectional shape of each of the plurality of rod-type lenses of the first optical member which is parallel to the light emission surface has a maximum width (d1) at the lens incident surface and a maximum height (h1) in a normal direction of the lens incident surface, and
   a ratio of the maximum height (h1) to the maximum width (d1) of the first optical member satisfies the following condition: $h1/d1 < 1$.

5. The display apparatus of claim 1, wherein the first and second light emitting device packages are alternately disposed on the circuit board.

6. The display apparatus of claim 1, wherein
   the first light emitting device package generates a blue light, and
   the second light emitting device package generates a magenta light.

7. The display apparatus of claim 1, wherein
   the first light emitting device package generates a blue light, and
   the second light emitting device package generates a green light or a red light.

8. The display apparatus of claim 1, wherein each of the first and second light emitting device packages comprises:
   a body part in which a cavity is defined;
   a light emitting device disposed in the cavity; and
   a molding part which fills the cavity and surrounds the light emitting device.

9. The display apparatus of claim 8, wherein the optical member is disposed on the molding part, a top surface of the body part and a side surface of the body part.

10. The display apparatus of claim 1, wherein the rod-type lenses are disposed adjacent to one another.

11. The display apparatus of claim 1, wherein
    the rod-type lenses are disposed to be spaced apart from one another, and
    each of the rod-type lenses comprises a base and a protrusion disposed on the base.

12. A display apparatus comprising:
    a display panel; and
    a backlight unit which provides light to the display panel, wherein the backlight unit comprises:

a light guide part having a light emission surface, a reflection surface facing the light emission surface, and connection surfaces which connects the light emission surface to the reflection surface;
a light source part comprising:
a circuit board;
first light emitting device packages disposed at an interval of a first distance on a central area of the circuit board;
second light emitting device packages disposed at an interval of a second distance on a peripheral area of the circuit board, wherein the first distance is less than the second distance,
wherein the light source part facing a light incident surface of the connection surfaces; and
an optical member disposed on the second light emitting device package, wherein each of the optical members comprises a plurality of rod-type lenses, and two or more rod-type lenses of the plurality of rod-type lenses are disposed on the second light emitting device package,
wherein a cross-sectional shape of each of the plurality of rod-type lenses which is parallel to the light emission surface has a maximum width (d) at the lens incident surface thereof which is a planar surface upon which light from the light source pan impinges first, and a maximum height (h) in a normal direction of the lens incident surface, and
wherein a ratio of the maximum height (h) to the maximum width (d) satisfies the following in equation: $h/d<1$.

13. The display apparatus of claim 12, wherein each of the plurality of rod-type lenses comprises:
the lens incident surface facing the second light emitting device packages; and
a lens emission surface facing the lens incident surface, wherein the lens emission surface includes a curved surface or an inclined surface.

14. The display apparatus of claim 13, wherein each of the plurality of rod-type lenses has a semicircular, semielliptical or triangular cross-section shape.

15. The display apparatus of claim 12, wherein each of the first and second light emitting device packages comprises:
a body part in which a cavity is defined;
a light emitting device disposed in the cavity; and
a molding part which fills the cavity and surrounds the light emitting device,
wherein the light emitting device emits a blue light, and the molding part comprises a phosphor which is excited by the blue light to generate a white light.

16. A display apparatus comprising:
a display panel; and
a backlight unit which provides light to the display panel, wherein the backlight unit comprises:
a light guide part having a light emission surface, a reflection surface facing the light emission surface, and connection surfaces which connect the light emission surface to the reflection surface;
a light source part comprising:
a circuit board;
a first light emitting device package disposed on the circuit board; and
a second light emitting device package disposed on the circuit board, wherein the second light emitting device generates light having a longer wavelength than a wavelength of light generated by the first light emitting device package,
wherein the light source part is disposed to face a light incident surface of the connection surfaces; and
an optical member comprising:
a first optical member disposed on the first light emitting device package,
wherein the first optical member comprises a plurality of rod-type lenses, and two or more rod-type lenses of the plurality of rod-type lenses are disposed on the first light emitting device package,
a cross-sectional shape of each of the plurality of rod-type lenses of the first optical member which is parallel to the light emission surface has a maximum width (d1) at the lens incident surface and a maximum height (h1) in a normal direction of the lens incident surface,
a ratio of the maximum height (h1) to the maximum width (d1) of the first optical member satisfies the following condition: $h1/d1<1$.

17. The display apparatus of claim 16, wherein the optical member further comprising:
a second optical member disposed on the second light emitting device package,
wherein the second optical member comprises a plurality of rod-type lenses, and two or more rod-type lenses of the plurality of rod-type lenses are disposed on the second light emitting device package,
wherein a cross-sectional shape of each of the plurality of rod-type lenses of the second optical member which is parallel to the light emission surface has a maximum width (d) at a lens incident surface which is a planar surface of the light upon which light from the light source impinges first, and a maximum height (h) in a normal direction of the lens incident surface, and
wherein a ratio of the maximum height (h) to the maximum width (d) of the second optical member satisfies the following condition: $h/d \geq 1$.

* * * * *